(12) United States Patent
Sugimori

(10) Patent No.: US 11,910,117 B2
(45) Date of Patent: Feb. 20, 2024

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventor: Yusaku Sugimori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 131 days.

(21) Appl. No.: 17/763,783

(22) PCT Filed: Sep. 18, 2020

(86) PCT No.: PCT/JP2020/035401
§ 371 (c)(1),
(2) Date: Mar. 25, 2022

(87) PCT Pub. No.: WO2021/065561
PCT Pub. Date: Apr. 8, 2021

(65) Prior Publication Data
US 2022/0345654 A1 Oct. 27, 2022

(30) Foreign Application Priority Data
Oct. 4, 2019 (JP) .................................. 2019-183423

(51) Int. Cl.
*H04N 25/77* (2023.01)
*H04N 25/533* (2023.01)
(Continued)

(52) U.S. Cl.
CPC ....... *H04N 25/77* (2023.01); *H01L 27/14634* (2013.01); *H04N 25/531* (2023.01);
(Continued)

(58) Field of Classification Search
CPC .... H04N 25/77; H04N 25/531; H04N 25/533; H04N 25/79; H04N 25/75; H04N 25/74;
(Continued)

(56) References Cited

U.S. PATENT DOCUMENTS

2007/0285548 A1* 12/2007 Gomi ................... H04N 25/533
348/308
2011/0060868 A1* 3/2011 Haukness ........... G06F 12/0246
711/E12.001
(Continued)

FOREIGN PATENT DOCUMENTS

CN 103312998 A 9/2013
CN 103716552 A 4/2014
(Continued)

OTHER PUBLICATIONS

International Search Report and Written Opinion of PCT Application No. PCT/JP2020/035401, dated Dec. 8, 2020, 08 pages of ISRWO.

*Primary Examiner* — Hung H Lam
(74) *Attorney, Agent, or Firm* — CHIP LAW GROUP

(57) ABSTRACT

The present disclosure relates to a solid-state imaging element and an electronic apparatus that can achieve a higher image quality. The imaging element includes a pixel having a global drive portion in which all rows are driven at a same timing and a rolling drive portion in which each row is driven at a corresponding timing, a pixel array region in which a plurality of the pixels is placed in an array, a global drive circuit configured to supply a drive signal to the global drive portion, and a rolling drive circuit configured to supply a drive signal to the rolling drive portion. Further, the global drive circuit is placed on each of at least three or more sides of four sides surrounding the pixel array region. The present technology is applicable to a stacked CMOS image sensor, for example.

11 Claims, 13 Drawing Sheets

(51) Int. Cl.
  *H01L 27/146* (2006.01)
  *H04N 25/79* (2023.01)
  *H04N 25/531* (2023.01)
  *H04N 25/75* (2023.01)

(52) U.S. Cl.
  CPC ........... *H04N 25/533* (2023.01); *H04N 25/79* (2023.01); *H04N 25/75* (2023.01)

(58) Field of Classification Search
  CPC .................. H04N 25/771; H04N 25/67; H01L 27/14634; H01L 27/14636; H01L 27/14612; H01L 27/14643
  See application file for complete search history.

(56) References Cited

U.S. PATENT DOCUMENTS

| | | | |
|---|---|---|---|
| 2011/0309236 A1* | 12/2011 | Tian | H01L 27/14638 257/E31.097 |
| 2013/0235242 A1 | 9/2013 | Watanabe | |
| 2013/0334403 A1 | 12/2013 | Kozlowski | |
| 2014/0092285 A1 | 4/2014 | Moriyama et al. | |
| 2015/0279884 A1 | 10/2015 | Kusumoto | |
| 2016/0227138 A1 | 8/2016 | Kozlowski | |
| 2017/0323912 A1* | 11/2017 | Lahav | H01L 27/14609 |
| 2018/0109741 A1 | 4/2018 | Sukegawa et al. | |
| 2019/0067359 A1 | 2/2019 | Matsumoto | |
| 2019/0074315 A1* | 3/2019 | Yasu | H01L 27/14636 |
| 2019/0383917 A1* | 12/2019 | Shinozuka | G01C 3/06 |

FOREIGN PATENT DOCUMENTS

| | | |
|---|---|---|
| CN | 107534049 A | 1/2018 |
| EP | 3288081 A1 | 2/2018 |
| JP | 2013-187607 A | 9/2013 |
| JP | 2014-072788 A | 4/2014 |
| KR | 10-2017-0141661 A | 12/2017 |
| WO | 2016/170833 A1 | 10/2016 |
| WO | WO-2019150981 A1 | 8/2019 |

* cited by examiner

SOLID-STATE IMAGING ELEMENT AND ELECTRONIC APPARATUS

CROSS REFERENCE TO RELATED APPLICATIONS

This application is a U.S. National Phase of International Patent Application No PCT/JP2020/035401 filed on Sep. 18, 2020, which claims priority benefit of Japanese Patent Application No. JP 2019-183423 filed in the Japan Patent Office on Oct. 4, 2019. Each of the above-referenced applications is hereby incorporated herein by reference in its entirety.

TECHNICAL FIELD

The present disclosure relates to a solid-state imaging element and an electronic apparatus, and in particular, to a solid-state imaging element and an electronic apparatus that can achieve a higher image quality.

BACKGROUND ART

Hitherto, in an electronic apparatus having an imaging function, such as a digital still camera and a digital video camera, solid-state imaging elements, for example, CCD (Charge Coupled Device) and CMOS (Complementary Metal Oxide Semiconductor) image sensors have been used. For example, in a CMOS image sensor, charges generated by photoelectric conversion in a photodiode are transferred to an FD (Floating Diffusion) unit, and a pixel signal that is output via an amplification transistor on the basis of the amount of charge is subjected to AD (Analog to Digital) conversion.

For example, PTL 1 discloses a CMOS image sensor capable of performing global shutter operation in which charge transfer from the photodiodes to the memories is performed in all the rows at the same timing.

CITATION LIST

Patent Literature

[PTL 1]
Japanese Patent Laid-open No. 2014-72788

SUMMARY

Technical Problem

Incidentally, the related-art CMOS image sensor has the configuration in which the drive circuit configured to perform global shutter operation is provided on one side of the pixel array region or each of the two facing sides of the pixel array region. Thus, the waveform may be rounded due to an IR drop caused by instantaneous current, a wiring delay, or the like, resulting in exposure time unevenness. In particular, in high-speed operation, exposure time unevenness is so large that it adversely affects the image quality. For this reason, it has been demanded to reduce such exposure time unevenness, thereby making it possible to take an image with a higher image quality.

The present disclosure has been made in view of such a circumstance and makes it possible to achieve a higher image quality.

Solution to Problem

According to an aspect of the present disclosure, there is provided a solid-state imaging element including a pixel having a global drive portion in which all rows are driven at a same timing and a rolling drive portion in which each row is driven at a corresponding timing, a pixel array region in which a plurality of the pixels is placed in an array, a global drive circuit configured to supply a drive signal to the global drive portion, and a rolling drive circuit configured to supply a drive signal to the rolling drive portion. The global drive circuit is placed on each of at least three or more sides of four sides surrounding the pixel array region.

According to another aspect of the present disclosure, there is provided an electronic apparatus including a solid-state imaging element. The solid-state imaging element includes a pixel having a global drive portion in which all rows are driven at a same timing and a rolling drive portion in which each row is driven at a corresponding timing, a pixel array region in which a plurality of the pixels is placed in an array, a global drive circuit configured to supply a drive signal to the global drive portion, and a rolling drive circuit configured to supply a drive signal to the rolling drive portion. The global drive circuit is placed on each of at least three or more sides of four sides surrounding the pixel array region.

According to an aspect of the present disclosure, there is provided a solid-state imaging element including a pixel having a global drive portion in which all rows are driven at a same timing and a rolling drive portion in which each row is driven at a corresponding timing, a pixel array region in which a plurality of the pixels is placed in an array, a global drive circuit configured to supply a drive signal to the global drive portion, and a rolling drive circuit configured to supply a drive signal to the rolling drive portion. Further, the global drive circuit is placed on each of at least three or more sides of four sides surrounding the pixel array region.

DESCRIPTION OF EMBODIMENTS

Specific embodiments to which the present technology is applied are described below in detail with reference to the drawings.

<First Configuration Example of Imaging Element>

Figure 1:
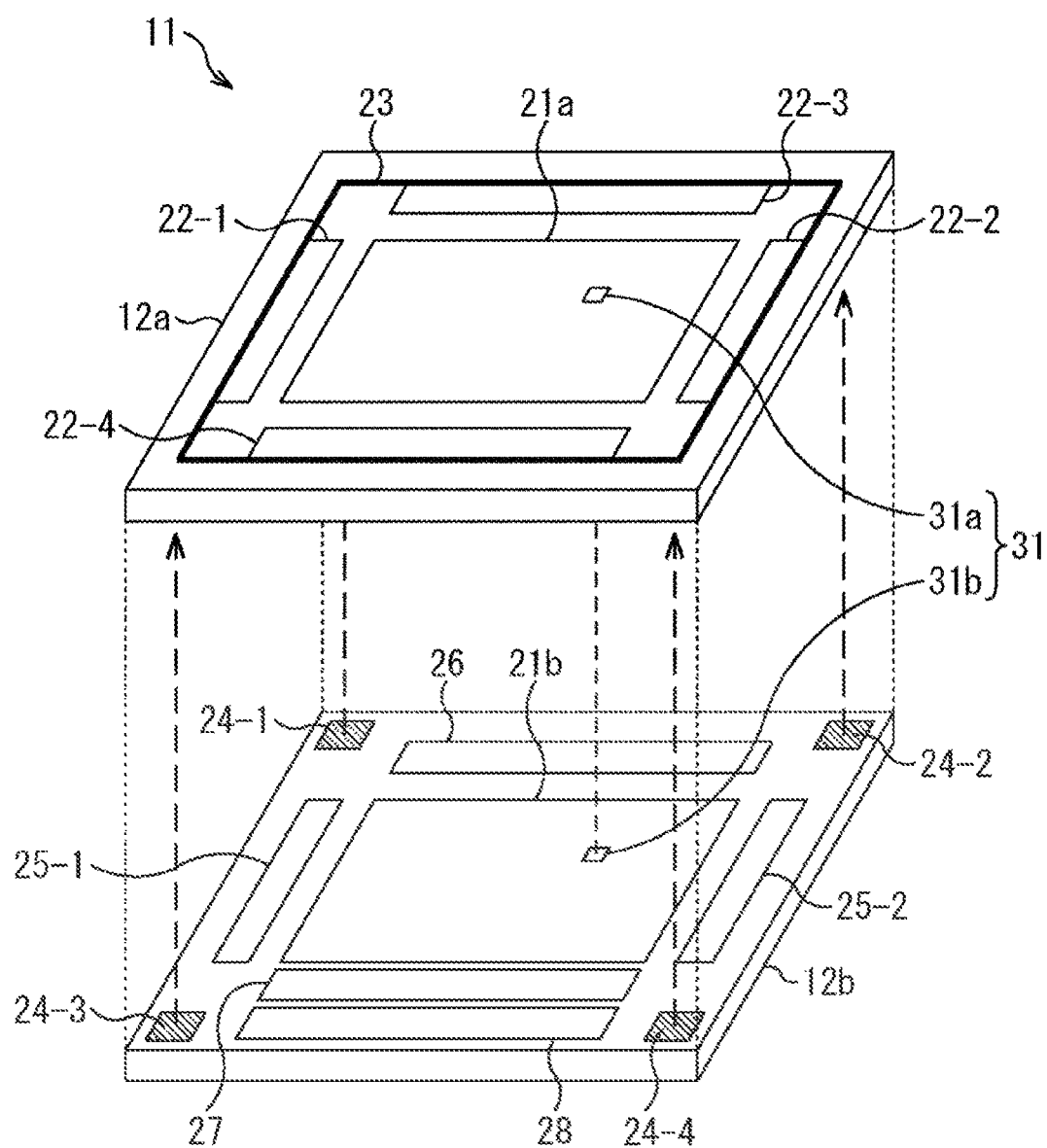
FIG. 1 is a diagram illustrating a configuration example of a first embodiment of an imaging element to which the present technology is applied.

FIG. 1 is a diagram illustrating a configuration example of a first embodiment of an imaging element to which the present technology is applied.

An imaging element 11 illustrated in FIG. 1 is, for example, a stacked CMOS image sensor including a plurality of chips 12 stacked. In the configuration example illustrated in FIG. 1, the imaging element 11 has a two-layer structure in which an upper chip 12a and a lower chip 12b are stacked.

Further, in the imaging element 11, a plurality of pixels 31 is placed in an array. The pixel 31 is formed across the upper chip 12a and the lower chip 12b. A portion of the pixel 31 that is provided on the upper chip 12a is referred to as an upper pixel 31a, and a portion of the pixel 31 that is provided on the lower chip 12b is referred to as a lower pixel 31b. The upper pixel 31a has a portion in which all the rows are driven at the same timing (hereinafter referred to as a global drive portion) and a portion in which each row is driven at a corresponding timing (hereinafter referred to as a rolling drive portion). Further, the lower pixel 31b has a rolling drive portion but does not have a global drive portion.

As illustrated in FIG. 1, on the upper chip 12a, a pixel array region 21a, global drive circuits 22-1 to 22-4, and a wire 23 are placed. Further, on the lower chip 12b, a pixel array region 21b, power pads 24-1 to 24-4, rolling drive circuits 25-1 and 25-2, a load MOS region 26, an AD conversion unit 27, and a horizontal transfer circuit 28 are placed.

In the pixel array region 21a, the upper pixels 31a are placed in an array, and in the pixel array region 21b, the lower pixels 31b are placed in an array.

The global drive circuits 22-1 to 22-4 are placed along the respective four sides of the pixel array region 21a. Each of the global drive circuits 22-1 to 22-4 outputs a signal for driving the global drive portion of the upper pixel 31a. For example, the global drive circuit 22-1 is placed along the left side of the pixel array region 21a, the global drive circuit 22-2 is placed along the right side of the pixel array region 21a, the global drive circuit 22-3 is placed along the upper side of the pixel array region 21a, and the global drive circuit 22-4 is placed along the lower side of the pixel array region 21a.

The wire 23 includes a power line for supplying electric power necessary for driving the global drive circuits 22-1 to 22-4 and a ground wire. The wire 23 is placed to surround the periphery (left side, right side, upper side, and lower side) of the upper chip 12a to be connected to each of the global drive circuits 22-1 to 22-4.

The power pads 24-1 to 24-4 are pads that are electrically and mechanically connected to the upper chip 12a, and are placed at the respective four corners of the lower chip 12b. For example, the power pads 24-1 to 24-4 are each connected to the wire 23 and supply externally supplied electric power to the global drive circuits 22-1 to 22-4 via the wire 23.

The rolling drive circuits 25-1 and 25-2 are placed along the respective two left and right sides of the pixel array region 21b. Each of the rolling drive circuits 25-1 and 25-2 outputs signals for driving the rolling drive portions of the upper pixel 31a and the lower pixel 31b.

In the load MOS region 26, for example, a plurality of MOS transistors that is used as a load element for reading out a pixel signal from the pixel 31 are placed.

The AD conversion unit 27 includes, for example, a comparator and a counter. The AD conversion unit 27 performs AD conversion on a pixel signal read out from the pixel 31 and outputs the pixel signal.

The horizontal transfer circuit 28 transfers, in the horizontal direction, pixel signals output from the AD conversion unit 27 column by column of the pixels 31, for example, and outputs the pixel signals to the signal processing unit on the latter stage of the imaging element 11.

Figure 2:
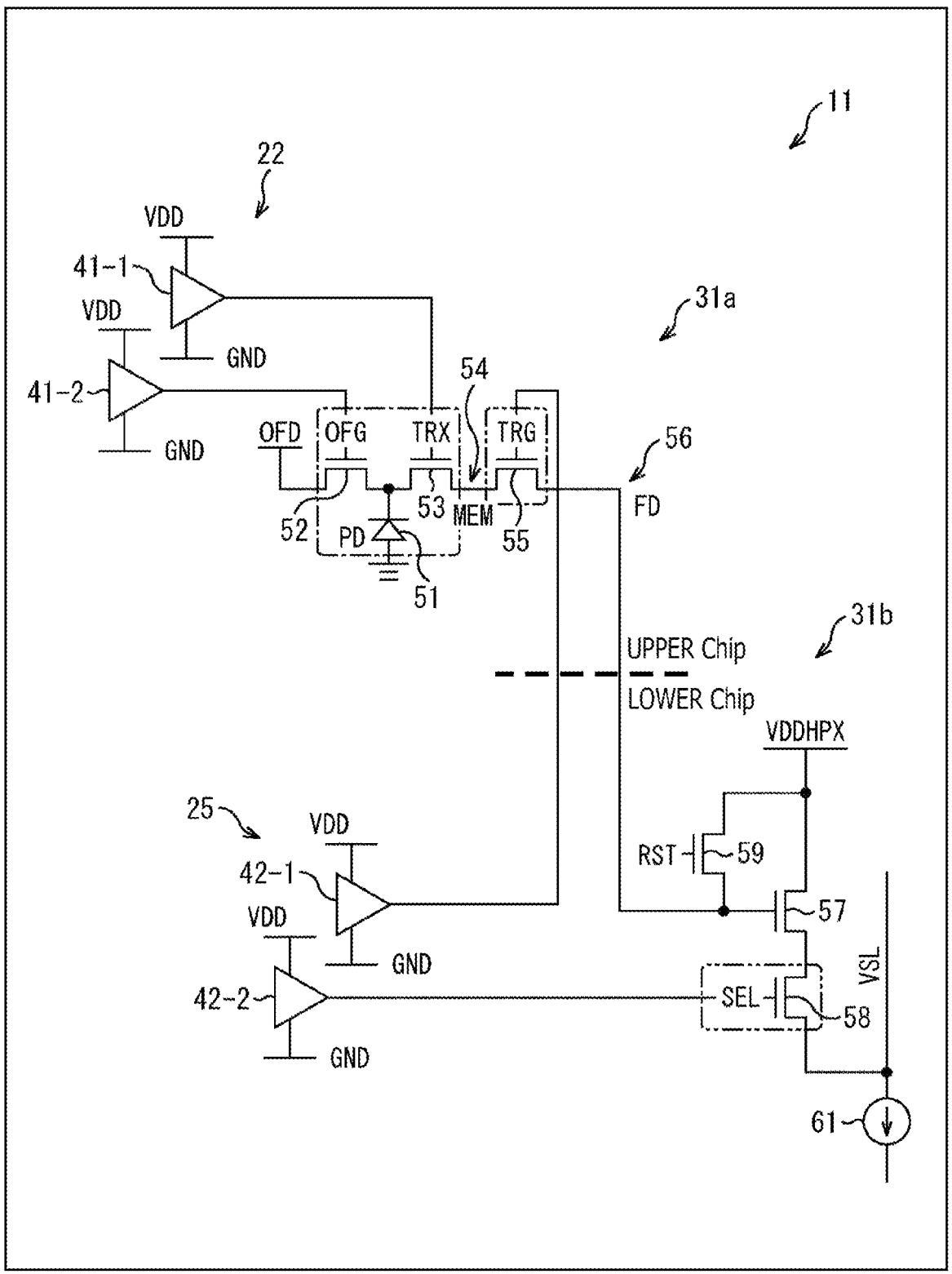
FIG. 2 is a diagram illustrating an exemplary circuit configuration of the imaging element of FIG. 1.

FIG. 2 is a diagram illustrating the circuit configuration of the imaging element 11.

As indicated by the dashed line illustrated in FIG. 2, the imaging element 11 is divided into the upper chip 12a and the lower chip 12b. Further, FIG. 2 illustrates the circuit configurations of the upper pixel 31a and the global drive circuit 22 of the upper chip 12a and the lower pixel 31b and the rolling drive circuit 25 of the lower chip 12b.

The upper pixel 31a includes a photodiode 51, a drain transistor 52, a transfer transistor 53, a memory 54, a read-out transistor 55, and an FD unit 56. The lower pixel 31b includes an amplification transistor 57, a selection transistor 58, and a reset transistor 59.

The photodiode 51 generates charges by photoelectric conversion and accumulates the charges.

The drain transistor 52 drives with a drain signal OFG and drains charges accumulated in the photodiode 51 to a drain OFD at a timing at which the exposure of the pixel 31 starts, for example. Further, the drain transistor 52 also has a function of causing charges generated exceeding the capacity of the photodiode 51 to overflow.

The transfer transistor 53 drives with a transfer signal TRX and transfers, during the exposure of the pixel 31, charges generated in the photodiode 51 to the memory 54.

The memory 54 temporarily holds charges transferred via the transfer transistor 53 until a timing at which the pixels 31 are read out row by row comes.

The read-out transistor 55 drives with a read-out signal TRG and reads out charges held in the memory 54 to the FD unit 56.

The FD unit 56 holds charges read out via the read-out transistor 55 and applies a potential based on the level of the charges to the gate electrode of the amplification transistor 57.

The amplification transistor 57 amplifies charges accumulated in the FD unit 56 and outputs a pixel signal based on the level of the charges to a vertical signal line VSL.

The selection transistor 58 drives with a selection signal SEL and connects the amplification transistor 57 to a constant current source 61 via the vertical signal line VSL.

The reset transistor 59 drives with a reset signal RST and drains charges accumulated in the memory 54 and the FD unit 56 to reset the pixel 31.

The global drive circuit 22 includes a plurality of amplifiers 41, that is, an amplifier 41-1 configured to supply the transfer signal TRX to the transfer transistor 53 and an amplifier 41-2 configured to supply the drain signal OFG to the drain transistor 52. Note that, in the following, the transfer signal TRX and the drain signal OFG that are output from the global drive circuit 22 are also referred to as global drive signals, as appropriate.

The rolling drive circuit 25 includes a plurality of amplifiers 42, that is, an amplifier 42-1 configured to supply the read-out signal TRG to the read-out transistor 55 and an amplifier 42-2 configured to supply the selection signal SEL to the selection transistor 58.

Thus, the photodiode 51, the drain transistor 52, and the transfer transistor 53, which are surrounded by the dashed-dotted line in FIG. 2, correspond to the global drive portion of the pixel 31. In a similar manner, the read-out transistor 55 and the selection transistor 58, which are surrounded by the long dashed double-short dashed line in FIG. 2, correspond to the rolling drive portion of the pixel 31.

The imaging element 11 is configured as described above such that the global drive circuits 22-1 to 22-4 supply global drive signals to the global drive portion of the pixel 31 from the four directions of the pixel array region 21a. Accordingly, the imaging element 11 has the configuration in which the number of the global drive circuits 22 which supply global drive signals, per pixel 31, is increased as compared to the related art, with the result that the imaging element 11 can decrease the rounding of the waveform of a global drive signal.

Figure 3A:
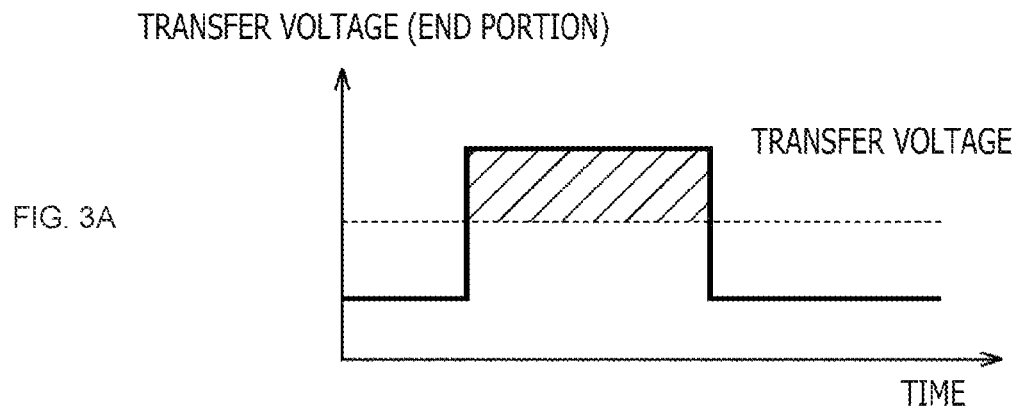
FIGS. 3A, 3B, and 3C depicts diagrams each illustrating an exemplary transfer voltage of a global drive signal.
Figure 3B:
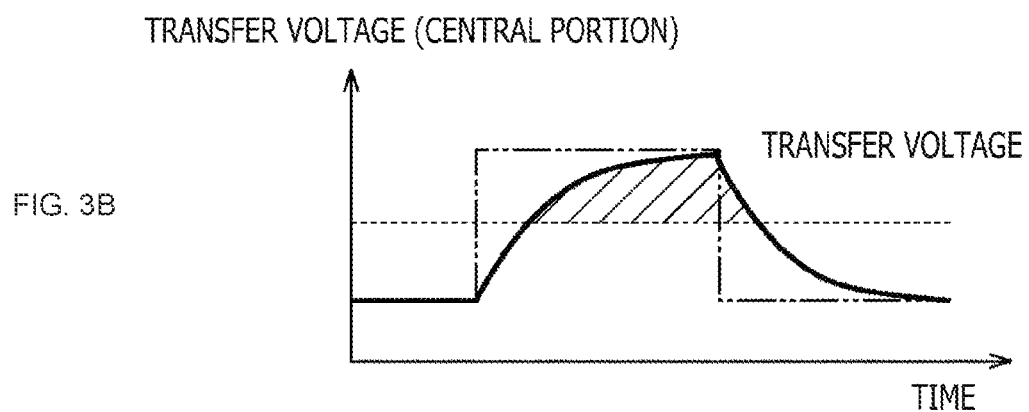
Figure 3C:
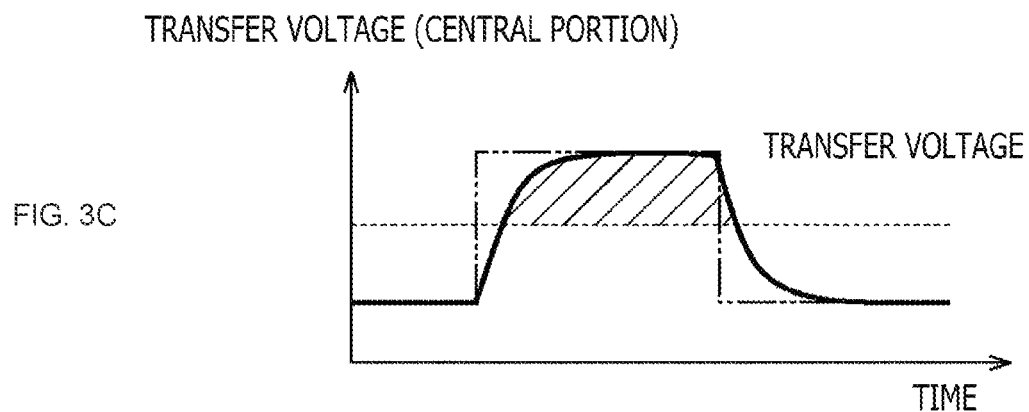

Here, with reference to FIGS. 3A, 3B, and 3C the waveform of a global drive signal that is output from the global drive circuit 22 is described.

For example, as illustrated in FIG. 3A, since the end portion of the pixel array region 21a is near the global drive circuit 22, the waveform of a global drive signal that is output from the global drive circuit 22 has substantially vertical pulse edges (with steep rising and falling changes). Further, at a portion closer to the central portion of the pixel array region 21a and farther from the global drive circuit 22, the waveform of the global drive signal is rounded.

For example, the related-art imaging element has the configuration in which the global drive circuit is provided on the one or each of the two sides of the pixel array region. For this reason, as illustrated in FIG. 3B, in the central portion of the pixel array region, as compared to the end portion, the waveform of the global drive signal is largely rounded (rising and falling changes are gentle).

In contrast to this, as illustrated in FIG. 3C, the imaging element 11 can reduce the rounding of the waveform of the global drive signal, that is, can prevent waveform rounding in the central portion of the pixel array region 21a as compared to the related-art imaging element.

As described above, the imaging element 11 can prevent the rounding of the waveform shape of a global drive signal in the central portion of the pixel array region 21a and thus drive the pixels 31 at the same timing over the entire pixel array region 21a. Further, the imaging element 11 has the configuration in which instantaneous current paths are distributed. Accordingly, the imaging element 11 can reduce the occurrence of exposure time unevenness, that is, can expose all the pixels 31 at exposure time that is the same timing, thereby being capable of taking a higher quality image even in high-speed operation (with short shutter time).

Moreover, the imaging element 11 has the efficient layout in which the global drive circuit 22 is placed on the upper chip 12a and the rolling drive circuit 25 is placed on the lower chip 12b, so that the chip size can be miniaturized as compared to a layout in which those drive circuits are placed on a single chip.

<Second Configuration Example of Imaging Element>

Figure 4:
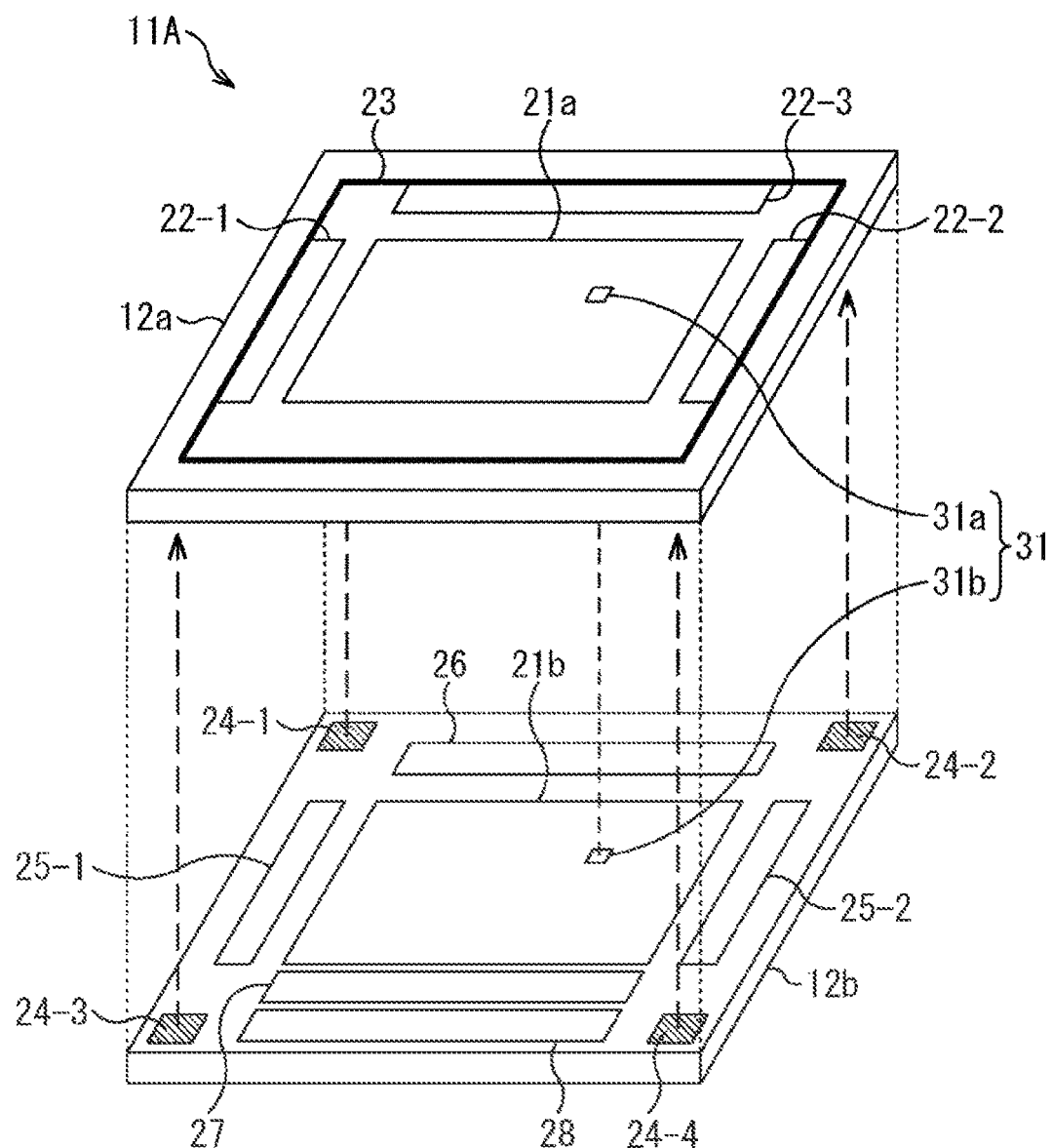
FIG. 4 is a diagram illustrating a configuration example of a second embodiment of an imaging element.

FIG. 4 is a diagram illustrating a configuration example of a second embodiment of an imaging element to which the present technology is applied. Note that, in an imaging element 11A illustrated in FIG. 4, components common to those of the imaging element 11 of FIG. 1 are denoted by the same reference signs and the detailed description thereof is omitted.

That is, the imaging element 11A includes, like the imaging element 11 of FIG. 1, the upper chip 12a and the lower chip 12b stacked. Further, the imaging element 11A is similar to the imaging element 11 of FIG. 1 in that the pixel array region 21a and the wire 23 are placed on the upper chip 12a and the pixel array region 21b, the power pads 24-1 to 24-4, the rolling drive circuits 25-1 and 25-2, the load MOS region 26, the AD conversion unit 27, and the horizontal transfer circuit 28 are placed on the lower chip 12b.

Further, the imaging element 11A is different from the imaging element 11 of FIG. 1 in that the three global drive circuits 22-1 to 22-3 are placed on the upper chip 12a.

For example, with the configuration in which the number of the global drive circuits 22 which supply global drive signals, per pixel 31, is increased as compared to the related art, the rounding of the waveform of a global drive signal can be decreased, as described above with reference to FIGS. 3A, 3B, and 3C. That is, the configuration in which the four global drive circuits 22-1 to 22-4 are provided like the imaging element 11 of FIG. 1 is not necessarily used, and it is sufficient that the configuration in which at least three or more of the global drive circuits 22 are provided is used.

Note that the three global drive circuits 22-1 to 22-3 are not necessarily placed on the left side, the right side, and the upper side as illustrated in FIG. 4. That is, the imaging element 11A may employ a configuration in which the global drive circuits 22-1 to 22-3 are placed on the left side, the right side, and the lower side, the left side, the upper side, and the lower side, or the right side, the upper side, and the lower side, for example.

Further, the circuit configuration of the imaging element 11A is similar to the circuit configuration of the imaging element 11 illustrated in FIG. 2.

The imaging element 11A configured as described above can prevent the rounding of the waveform of a global drive signal to reduce the occurrence of exposure time unevenness as compared to the related-art imaging element, thereby being capable of taking a higher quality image.

<Third Configuration Example of Imaging Element>

Figure 5:
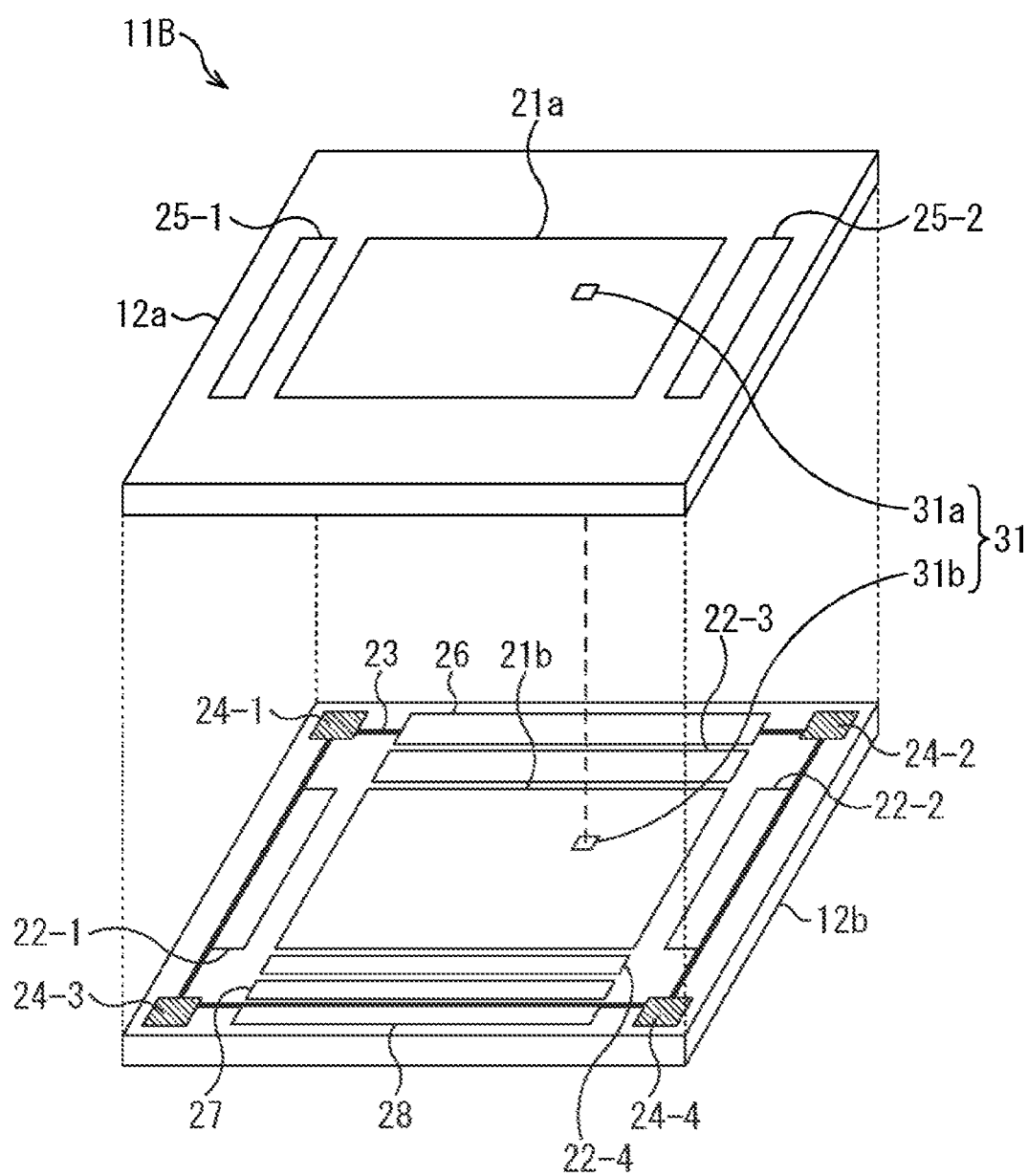
FIG. 5 is a diagram illustrating a configuration example of a third embodiment of an imaging element.

FIG. 5 is a diagram illustrating a configuration example of a third embodiment of an imaging element to which the present technology is applied. Note that, in an imaging element 11B illustrated in FIG. 5, components common to those of the imaging element 11 of FIG. 1 are denoted by the same reference signs and the detailed description thereof is omitted.

That is, the imaging element 11B includes, like the imaging element 11 of FIG. 1, the upper chip 12a and the lower chip 12b stacked. Further, the imaging element 11B is similar to the imaging element 11 of FIG. 1 in that the pixel array region 21a is placed on the upper chip 12a and the pixel array region 21b, the power pads 24-1 to 24-4, the load MOS region 26, the AD conversion unit 27, and the horizontal transfer circuit 28 are placed on the lower chip 12b.

Further, the imaging element 11A is different from the imaging element 11 of FIG. 1 in that the rolling drive circuits 25-1 and 25-2 are placed on the upper chip 12a and the global drive circuits 22-1 to 22-4 are placed on the lower chip 12b.

As described above, also the imaging element 11B having the configuration in which the global drive circuits 22-1 to 22-4 are provided on the lower chip 12b to drive the global drive portion of the upper pixel 31a placed in the pixel array region 21a of the upper chip 12a can decrease the rounding of the waveform of a global drive signal. In particular, the imaging element 11B has the configuration in which the global drive circuits 22-1 to 22-4 are placed near the power pads 24-1 to 24-4 and can thus supply a larger amount of electric power to the global drive circuits 22-1 to 22-4. Accordingly, the imaging element 11B can further decrease the rounding of the waveform of a global drive signal.

Further, the circuit configuration of the imaging element 11B is similar to the circuit configuration of the imaging element 11 illustrated in FIG. 2.

The imaging element 11B configured as described above can prevent the rounding of the waveform of a global drive signal to reduce the occurrence of exposure time unevenness as compared to the related-art imaging element, thereby being capable of taking a higher quality image.

<Fourth Configuration Example of Imaging Element>

Figure 6:
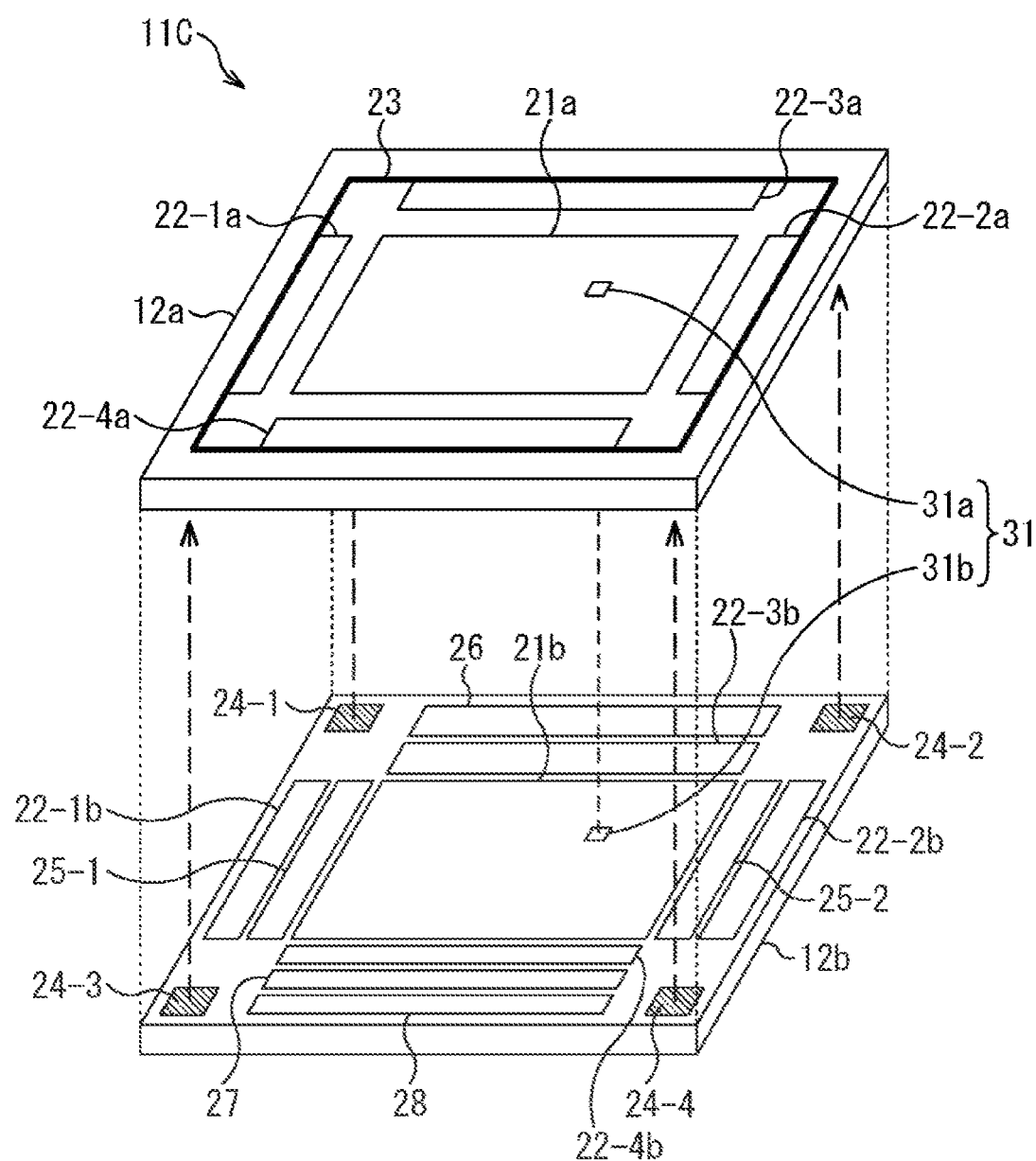
FIG. 6 is a diagram illustrating a configuration example of a fourth embodiment of an imaging element.

FIG. 6 is a diagram illustrating a configuration example of a fourth embodiment of an imaging element to which the present technology is applied. Note that, in an imaging element 11C illustrated in FIG. 6, components common to those of the imaging element 11 of FIG. 1 are denoted by the same reference signs and the detailed description thereof is omitted.

That is, the imaging element 11C includes, like the imaging element 11 of FIG. 1, the upper chip 12a and the lower chip 12b stacked. Further, the imaging element 11C is similar to the imaging element 11 of FIG. 1 in that the pixel array region 21a and the wire 23 are placed on the upper chip 12a and the pixel array region 21b, the power pads 24-1 to 24-4, the rolling drive circuits 25-1 and 25-2, the load MOS region 26, the AD conversion unit 27, and the horizontal transfer circuit 28 are placed on the lower chip 12b.

Further, the imaging element 11C is different from the imaging element 11 of FIG. 1 in that global drive circuits 22-1a to 22-4a are placed on the upper chip 12a and global drive circuits 22-1b to 22-4b are placed on the lower chip 12b. That is, in the imaging element 11C, the global drive circuit 22 includes global drive circuits 22a and 22b such that the global drive circuit 22 is formed across the upper chip 12a and the lower chip 12b.

Figure 7:
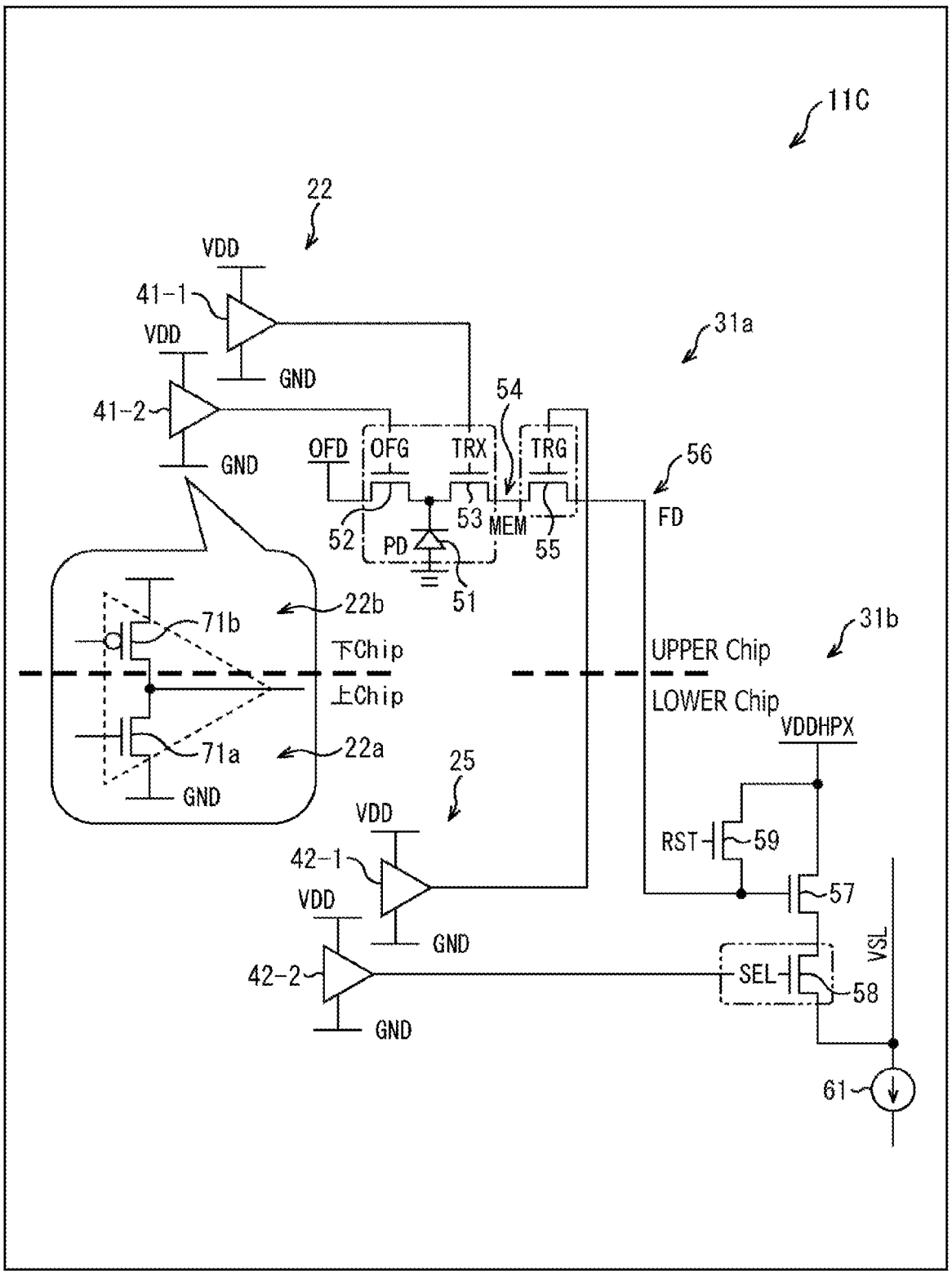
FIG. 7 is a diagram of an exemplary circuit configuration of the imaging element of FIG. 6.

With reference to FIG. 7, the structure of the global drive circuit 22 of the imaging element 11C is described. Note that the amplifiers 41-1 and 41-2 which are configured in a similar manner are hereinafter simply referred to as an amplifier 41.

As illustrated in FIG. 7, in the imaging element 11C, the amplifier 41 of the global drive circuit 22 includes an N-type transistor 71a and a P-type transistor 71b. Further, the imaging element 11C has the layout in which the N-type transistor 71a is placed in the global drive circuit 22a of the upper chip 12a and the P-type transistor 71b is placed in the global drive circuit 22b of the lower chip 12b.

With the imaging element 11C having such a configuration, for example, in a case where the upper pixel 31a only includes an N-type transistor, the upper chip 12a can be manufactured only using the NMOS process.

Further, the imaging element 11C can decrease the rounding of the waveform of a global drive signal only at the falling of the global drive signal (high level to low level). Thus, also the imaging element 11C can reduce the occurrence of exposure time unevenness, thereby being capable of taking a higher quality image than that in a case of the related-art imaging element.

<Fifth Configuration Example of Imaging Element>

Figure 8:
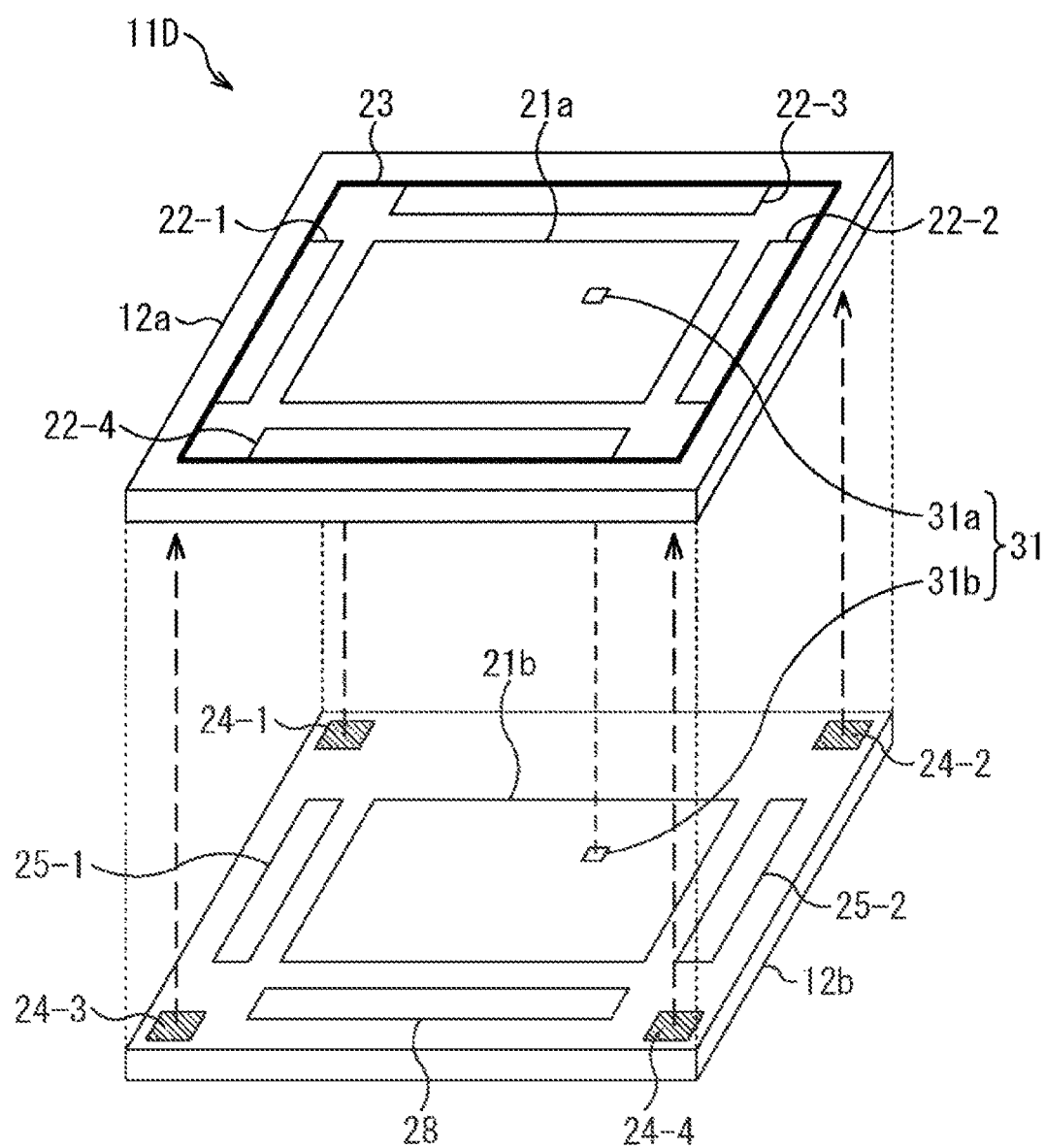
FIG. 8 is a diagram illustrating a configuration example of a fifth embodiment of an imaging element.

FIG. 8 is a diagram illustrating a configuration example of a fifth embodiment of an imaging element to which the present technology is applied. Note that, in an imaging element 11D illustrated in FIG. 8, components common to those of the imaging element 11 of FIG. 1 are denoted by the same reference signs and the detailed description thereof is omitted.

That is, the imaging element 11D includes, like the imaging element 11 of FIG. 1, the upper chip 12a and the lower chip 12b stacked. Further, the imaging element 11D is similar to the imaging element 11 of FIG. 1 in that the pixel array region 21a, the global drive circuits 22-1 to 22-4, and the wire 23 are placed on the upper chip 12a and the pixel array region 21b, the power pads 24-1 to 24-4, the rolling drive circuits 25-1 and 25-2, and the horizontal transfer circuit 28 are placed on the lower chip 12b.

Further, the imaging element 11D is different from the imaging element 11 of FIG. 1 in that an analog pixel signal is subjected to AD conversion inside the pixel 31 and a digital pixel signal is output.

Figure 9:
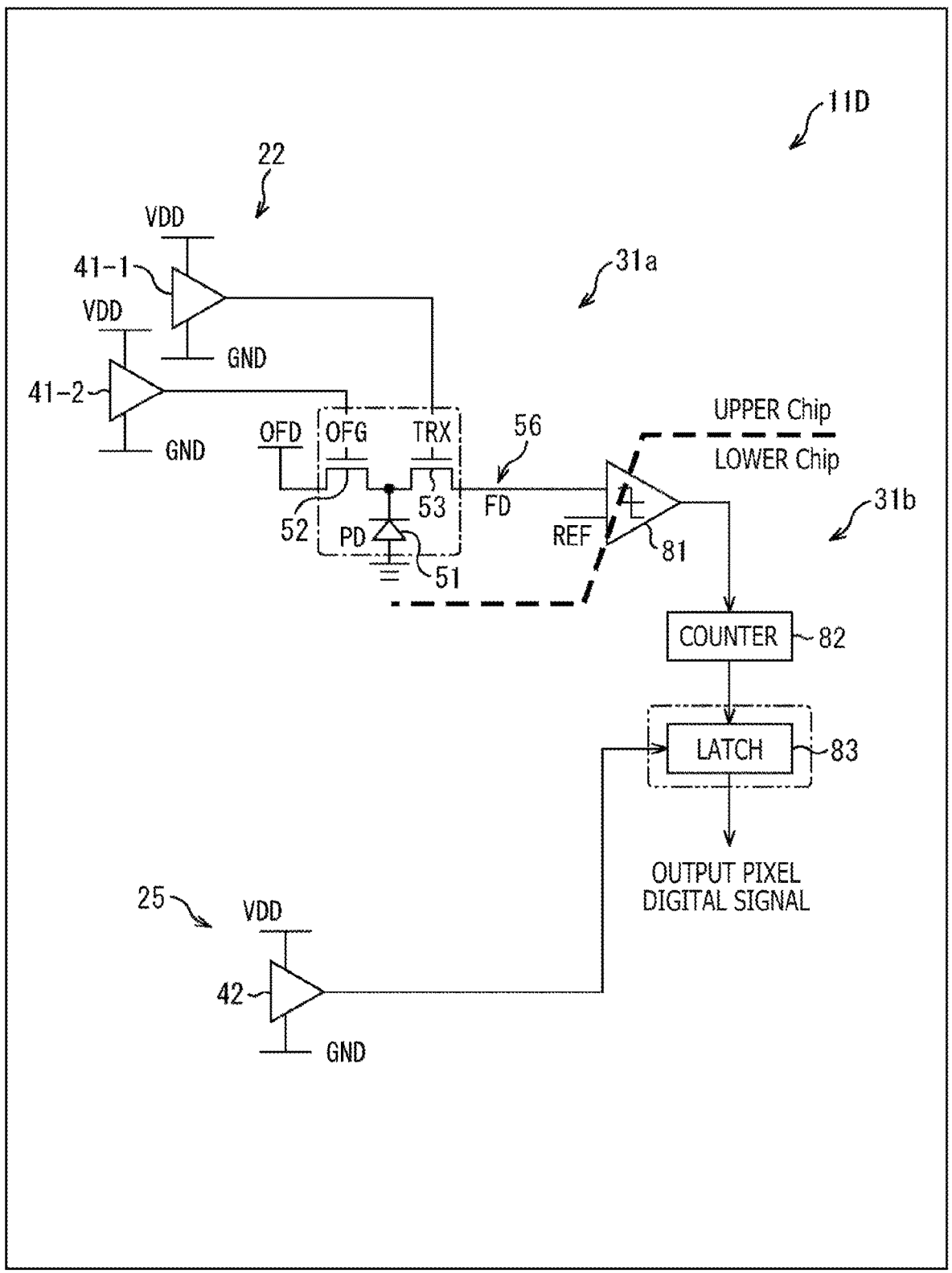
FIG. 9 is a diagram of an exemplary circuit configuration of the imaging element of FIG. 8.

With reference to FIG. 9, the configuration of the pixel 31 of the imaging element 11D is described.

As illustrated in FIG. 9, the pixel 31 includes the photodiode 51, the drain transistor 52, the transfer transistor 53, the FD unit 56, a comparator 81, a counter 82, and a latch 83. Further, the pixel 31 has the structure in which the comparator 81 is formed across the upper chip 12a and the lower chip 12b and performs, by the comparator 81 and the counter 82, AD conversion on charges accumulated in the FD unit 56.

Further, the imaging element 11D is configured to supply a latch data read out control signal from the rolling drive circuit 25 to the latch 83, and in a case where digital pixel signals are read out row by row, the latch 83 can be regarded as the rolling drive portion of the pixel 31. That is, the rolling drive portion of the pixel 31 is configured to handle not analog signals but digital signals.

The imaging element 11D configured as described above can prevent the rounding of the waveform of a global drive signal to reduce the occurrence of exposure time unevenness as compared to the related-art imaging element, thereby being capable of taking a higher quality image.

<Stack Configuration of Imaging Element>

Figure 10:
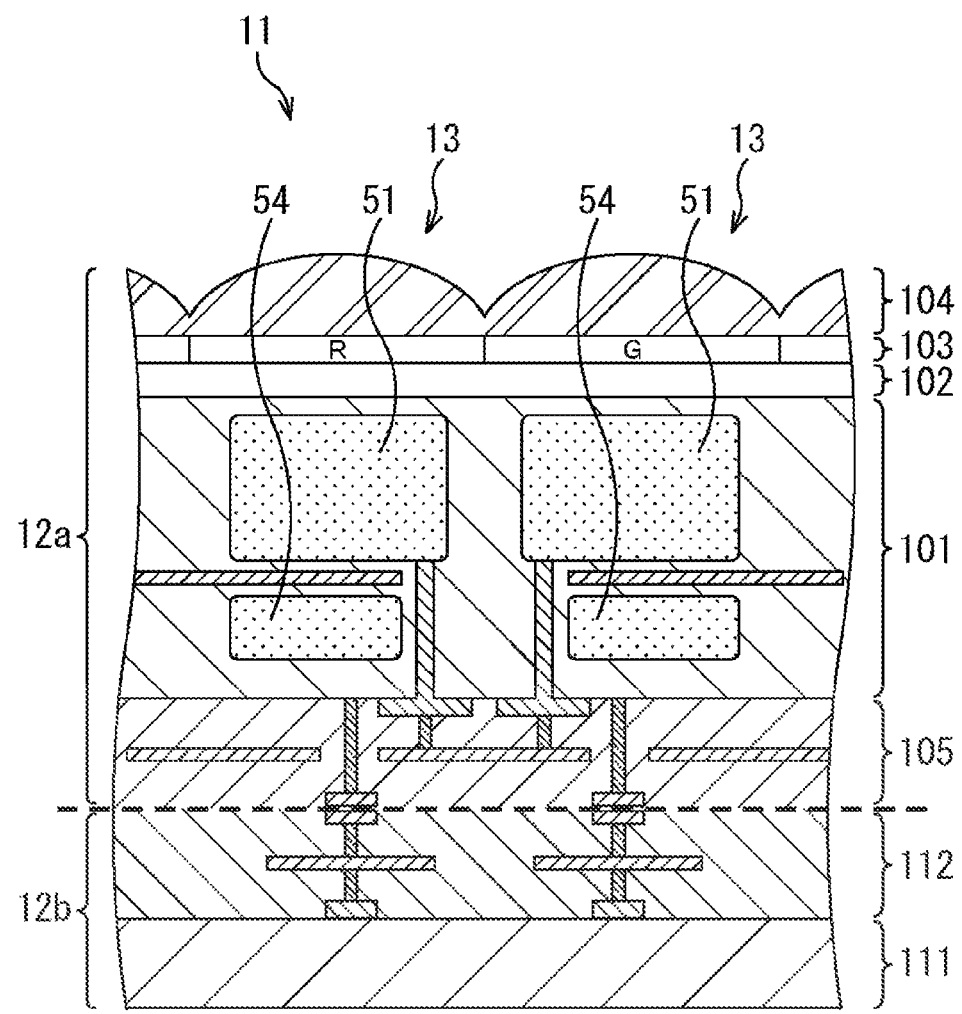
FIG. 10 is a diagram illustrating a cross-sectional configuration example of the imaging element having a two-layer structure.
Figure 11:
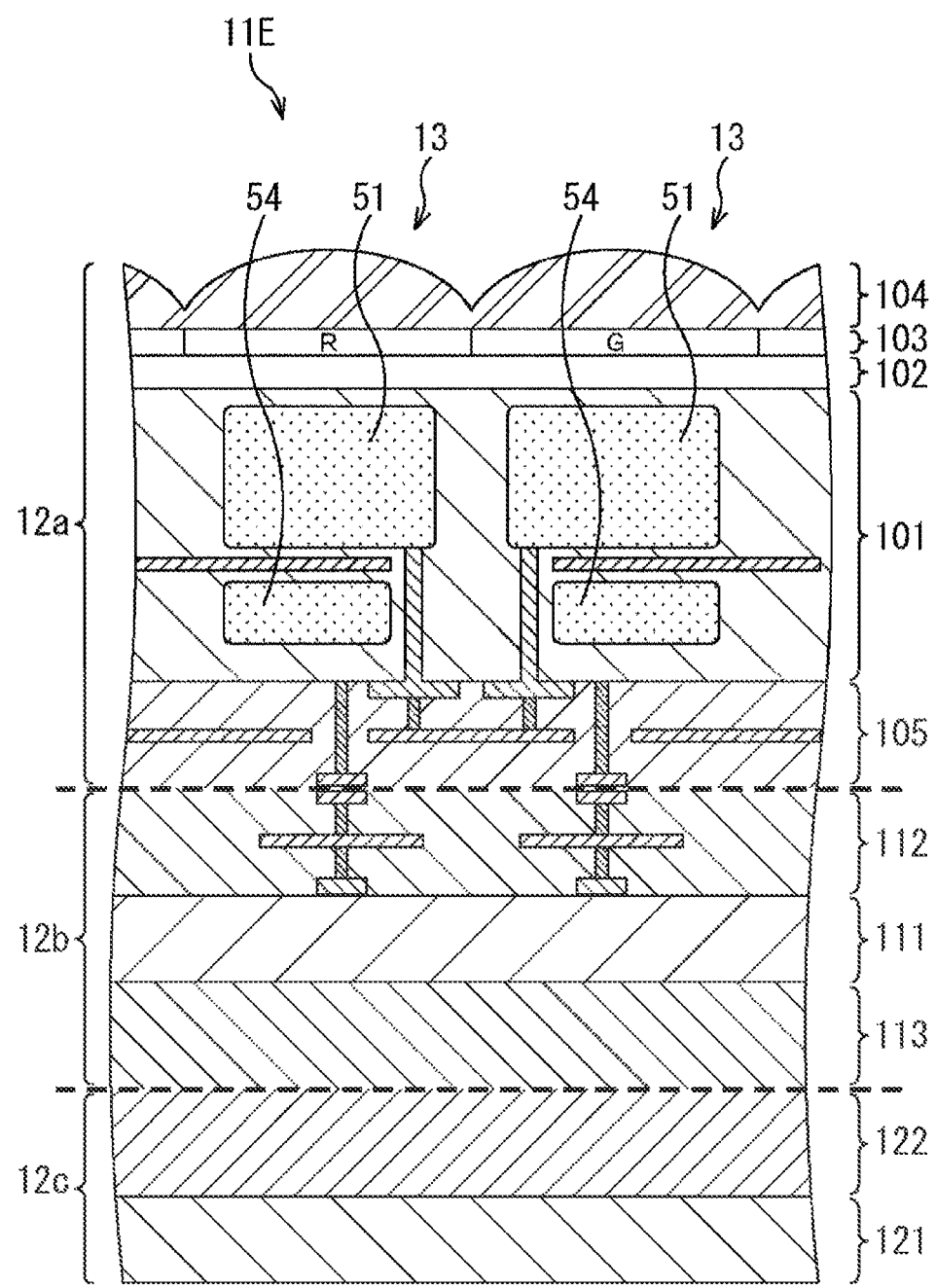
FIG. 11 is a diagram illustrating a cross-sectional configuration example of an imaging element having a three-layer structure.

With reference to FIG. 10 and FIG. 11, the stack configuration of the imaging element 11 is described.

FIG. 10 illustrates a cross-sectional configuration example of the imaging element 11 having the two-layer structure as described above.

The upper chip 12a has a cross section in which an insulating layer 102, a filter layer 103, and an on-chip lens layer 104 are stacked on the back side of a semiconductor layer 101 and a wiring layer 105 is stacked on the front side of the semiconductor layer 101. For example, in the semiconductor layer 101, the photodiode 51, the memory 54, and the like are formed for each of the pixels 31, and the memory 54 is protected from light.

The lower chip 12b has a cross section in which a wiring layer 112 is stacked on a semiconductor layer 111.

Further, in the imaging element 11, a connection pad formed so as to be exposed from the wiring layer 105 of the upper chip 12a and a connection pad formed so as to be exposed from the wiring layer 112 of the lower chip 12b are electrically and mechanically connected to each other.

The imaging element 11 having such a stack structure has the configuration in which a logic circuit or the like is provided in the peripheral region on the outer side of the pixel array region 21b of the lower chip 12b, for example. Thus, in a case where the upper chip 12a and the lower chip 12b have the same chip size, there is obtained a layout with a margin in which elements and the like are not formed in the peripheral region on the outer side of the pixel array region 21a of the upper chip 12a. Thus, the imaging element 11 has the layout in which the global drive circuits 22-1 to 22-4 are provided in the peripheral region of the upper chip 12a and can thus increase the packaging density more effectively.

FIG. 11 illustrates a cross-sectional configuration example of an imaging element 11E having a three-layer structure.

That is, the imaging element 11E includes the upper chip 12a, the lower chip 12b, and a logic chip 12c stacked.

The upper chip 12a has a cross section similar to that of the upper chip 12a of FIG. 10, and the lower chip 12b has a cross section in which a wiring layer 113 for stacking the lower chip 12b on the logic chip 12c is added. The logic chip 12c has a cross section in which a wiring layer 122 is stacked on a semiconductor layer 121.

Further, in the imaging element 11E, a logic circuit is formed on the logic chip 12c, and the load MOS region 26, the AD conversion unit 27, and the horizontal transfer circuit 28 can also be formed on the logic chip 12c. Thus, the imaging element 11E can employ the layout in which the global drive circuits 22-1 to 22-4 are provided in the peripheral region of the upper chip 12a and the rolling drive circuits 25-1 and 25-2 are provided in the peripheral region of the lower chip 12b.

The imaging element 11E having such a stack structure can be further miniaturized as compared to the configuration in which a logic circuit or the like is provided in the peripheral region of the lower chip 12b like the imaging element 11 having the two-layer structure.

<Configuration Example of Electronic Apparatus>

The imaging element 11 as described above is applicable to various electronic apparatuses, for example, an imaging system such as a digital still camera and a digital video camera, a mobile phone having an imaging function, and other devices having the imaging function.

Figure 12:
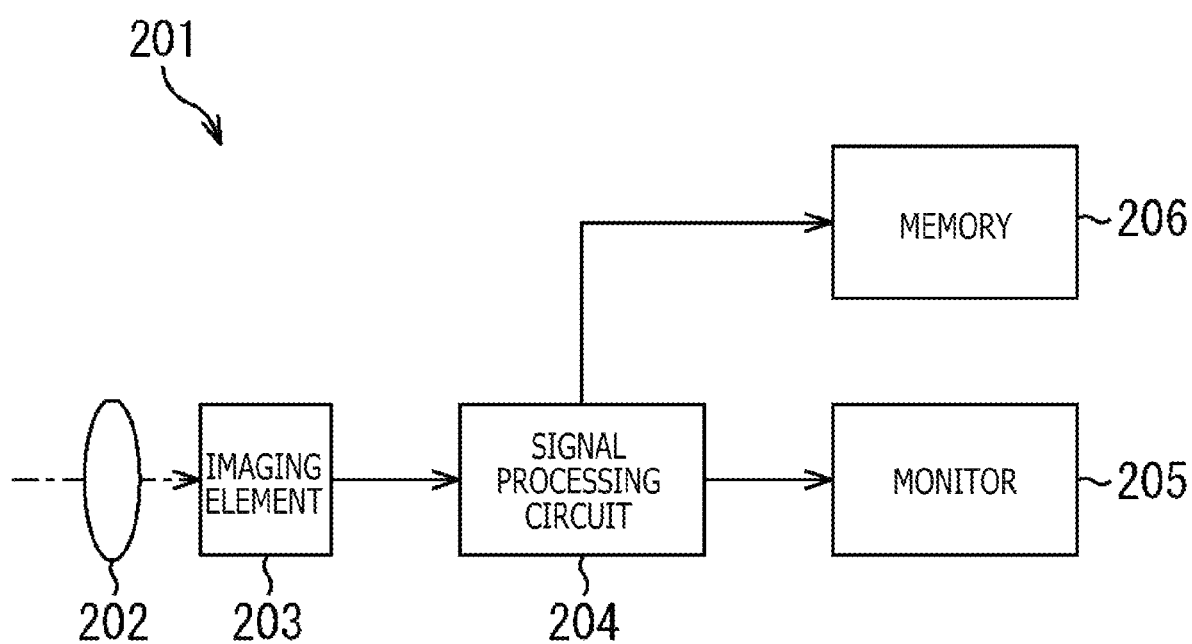
FIG. 12 is a block diagram illustrating a configuration example of an imaging device.

FIG. 12 is a block diagram illustrating a configuration example of an imaging device that is mounted on an electronic apparatus.

As illustrated in FIG. 12, an imaging device 201 includes an optical system 202, an imaging element 203, a signal processing circuit 204, a monitor 205, and a memory 206, and can take still images and moving images.

The optical system 202 includes one or a plurality of lenses. The optical system 202 guides, to the imaging element 203, image light (incident light) from an object and forms an image on the light receiving surface (sensor unit) of the imaging element 203.

As the imaging element 203, the imaging element 11 described above is applied. In the imaging element 203, for a certain period, electrons are accumulated on the basis of an image formed on the light receiving surface via the optical system 202. Then, a signal based on the electrons accumulated in the imaging element 203 is supplied to the signal processing circuit 204.

The signal processing circuit 204 performs various types of signal processing on a pixel signal output from the imaging element 203. An image (image data) obtained by the signal processing circuit 204 performing signal processing is supplied to the monitor 205 to be displayed on the monitor 205, or is supplied to the memory 206 to be stored (recorded) in the memory 206.

By applying the above-described imaging element 11 to the imaging device 201 configured as described above, for example, a higher quality image can be taken.

<Examples of Use of Image Sensor>

Figure 13:
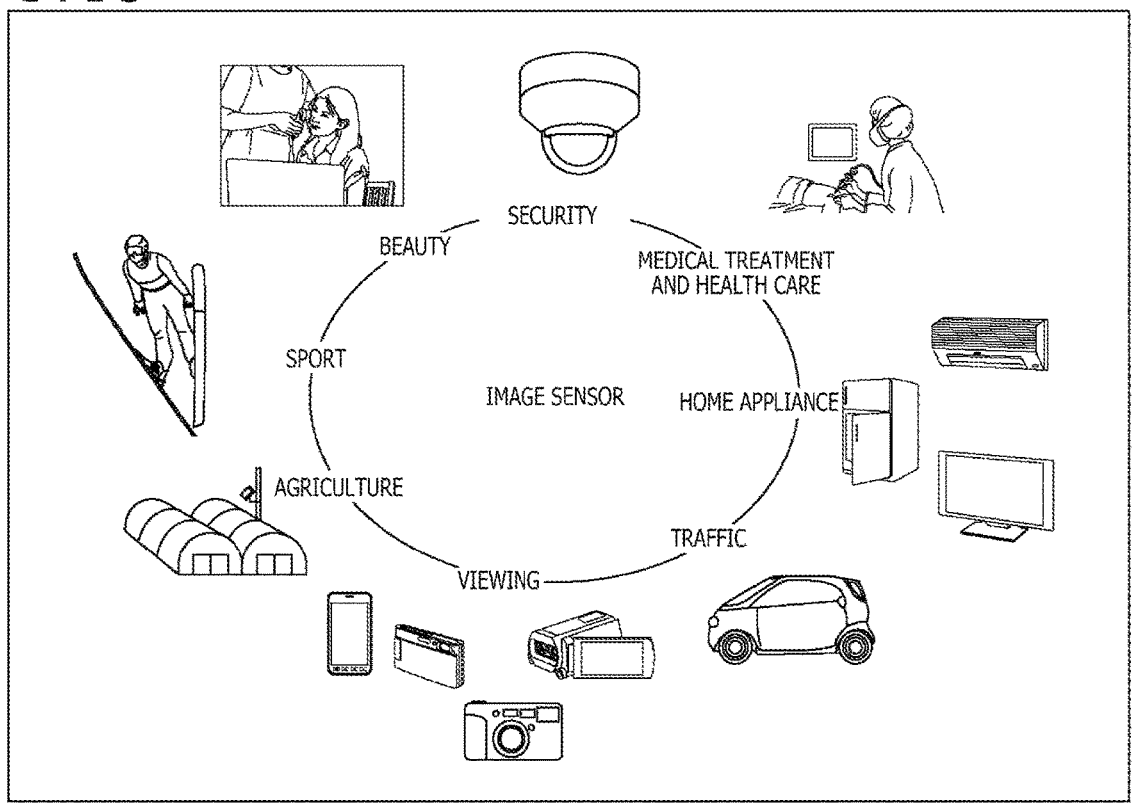
FIG. 13 is a diagram illustrating examples of use of an image sensor.

FIG. 13 is a diagram illustrating examples of use of the image sensor (imaging element) described above.

The image sensor described above can be used in various cases in which, for example, light such as visible light, infrared light, ultraviolet light, or X-rays is sensed as described below.

Devices configured to take images for viewing, such as digital cameras and camera function-equipped portable devices Devices provided for traffic, such as on-vehicle sensors that photograph the front side, rear side, surroundings, inside, and the like of an automobile for the purpose of safe driving such as automatic stop and driver condition recognition; monitoring cameras that monitor traveling vehicles and roads; and ranging sensors that measure a distance between vehicles and the like Devices provided for home appliances such as TVs, refrigerators, and air conditioners, in order to photograph the user's gesture and perform device operation on the basis of the gesture Devices provided for medical treatment and health care, such as endoscopes and devices that perform angiography by receiving infrared light Devices provided for security, such as monitoring cameras for crime prevention and cameras for personal authentication Devices provided for beauty, such as skin measuring devices that photograph skin and microscopes that photograph scalps Devices provided for sports, such as action cameras and wearable cameras for sport usage or the like Devices provided for agriculture, such as cameras for monitoring the condition of fields and crops <Examples of Configuration Combinations>

Note that the present technology can also take the following configurations.

(1)

A solid-state imaging element including:
a pixel having a global drive portion in which all rows are driven at a same timing and a rolling drive portion in which each row is driven at a corresponding timing;
a pixel array region in which a plurality of the pixels is placed in an array;
a global drive circuit configured to supply a drive signal to the global drive portion; and
a rolling drive circuit configured to supply a drive signal to the rolling drive portion,
in which the global drive circuit is placed on each of at least three or more sides of four sides surrounding the pixel array region.

(2)

The solid-state imaging element according to Item (1), in which the global drive circuit includes four global drive circuits placed along a left side, a right side, an upper side, and a lower side of the pixel array region.

(3)

The solid-state imaging element according to Item (1) or (2), in which the solid-state imaging element has a stack structure in which at least two chips are stacked.

(4)

The solid-state imaging element according to Item (3), in which the pixel is formed across an upper chip on which the global drive portion and the rolling drive circuit are provided and a lower chip on which the rolling drive circuit is provided.

(5)
The solid-state imaging element according to Item (4),
in which the global drive circuit is placed in a peripheral region of the pixel array region on the upper chip, and
the rolling drive circuit is placed in a peripheral region of the pixel array region on the lower chip.

(6)
The solid-state imaging element according to Item (4),
in which the rolling drive circuit is placed in a peripheral region of the pixel array region on the upper chip, and
the global drive circuit is placed in a peripheral region of the pixel array region on the lower chip.

(7)
The solid-state imaging element according to any one of Items (4) to (6), in which the global drive circuit is formed across the upper chip and the lower chip.

(8)
The solid-state imaging element according to Item (7),
in which an N-type transistor forming the global drive circuit is placed on the upper chip, and
a P-type transistor forming the global drive circuit is placed on the lower chip.

(9)
The solid-state imaging element according to any one of Items (1) to (8),
in which the global drive portion includes a photodiode, a drain transistor, and a transfer transistor that form the pixel, and
the rolling drive portion includes a read-out transistor and a selection transistor that form the pixel.

(10)
The solid-state imaging element according to any one of Items (1) to (9),
in which the pixel includes a comparator and a counter for performing AD conversion on an analog pixel signal inside the pixel and outputting a digital pixel signal,
the global drive portion includes a photodiode, a drain transistor, and a transfer transistor that form the pixel, and
the rolling drive portion includes a latch forming the pixel.

(11)
An electronic apparatus including:
a solid-state imaging element including
a pixel having a global drive portion in which all rows are driven at a same timing and a rolling drive portion in which each row is driven at a corresponding timing,
a pixel array region in which a plurality of the pixels is placed in an array,
a global drive circuit configured to supply a drive signal to the global drive portion, and
a rolling drive circuit configured to supply a drive signal to the rolling drive portion,
the global drive circuit being placed on each of at least three or more sides of four sides surrounding the pixel array region.

Note that the present embodiments are not limited to the embodiments described above, and various modifications can be made without departing from the gist of the present disclosure. Further, the effects described herein are only exemplary and not limitative, and other effects may be provided.

REFERENCE SIGNS LIST

11: Imaging element
12: Chip
12a: Upper chip
12b: Lower chip
21a and 21b: Pixel array regions
22: Global drive circuit
23: Wire
24: Power pad
25: Rolling drive circuit
26: Load MOS region
27: AD conversion unit
28: Horizontal transfer circuit
31: Pixel
31a: Upper pixel
31b: Lower pixel
41 and 42: Amplifiers
51: Photodiode
52: Drain transistor
53: Transfer transistor
54: Memory
55: Read-out transistor
56: FD unit
57: Amplification transistor
58: Selection transistor
59: Reset transistor
61: Constant current source
71a: N-type transistor
71b: P-type transistor
81: Comparator
82: Counter
83: Latch

The invention claimed is:

1. A solid-state imaging element comprising:
a pixel having a global drive portion in which all rows are driven at a same timing and a rolling drive portion in which each row is driven at a corresponding timing;
a pixel array region in which a plurality of the pixels is placed in an array;
a global drive circuit configured to supply a drive signal to the global drive portion; and
a rolling drive circuit configured to supply a drive signal to the rolling drive portion,
wherein the global drive circuit is placed on each of at least three or more sides of four sides surrounding the pixel array region.

2. The solid-state imaging element according to claim 1, wherein the global drive circuit includes four global drive circuits placed along a left side, a right side, an upper side, and a lower side of the pixel array region.

3. The solid-state imaging element according to claim 1, wherein the solid-state imaging element has a stack structure in which at least two chips are stacked.

4. The solid-state imaging element according to claim 3, wherein the pixel is formed across an upper chip on which the global drive portion and the rolling drive circuit are provided and a lower chip on which the rolling drive circuit is provided.

5. The solid-state imaging element according to claim 4, wherein the global drive circuit is placed in a peripheral region of the pixel array region on the upper chip, and
the rolling drive circuit is placed in a peripheral region of the pixel array region on the lower chip.

6. The solid-state imaging element according to claim 4, wherein the rolling drive circuit is placed in a peripheral region of the pixel array region on the upper chip, and
the global drive circuit is placed in a peripheral region of the pixel array region on the lower chip.

7. The solid-state imaging element according to claim 4, wherein the global drive circuit is formed across the upper chip and the lower chip.

8. The solid-state imaging element according to claim 7, wherein an N-type transistor forming the global drive circuit is placed on the upper chip, and
a P-type transistor forming the global drive circuit is placed on the lower chip.

9. The solid-state imaging element according to claim 1, wherein the global drive portion includes a photodiode, a drain transistor, and a transfer transistor that form the pixel, and
the rolling drive portion includes a read-out transistor and a selection transistor that form the pixel.

10. The solid-state imaging element according to claim 1, wherein the pixel includes a comparator and a counter for performing AD conversion on an analog pixel signal inside the pixel and outputting a digital pixel signal,
the global drive portion includes a photodiode, a drain transistor, and a transfer transistor that form the pixel, and
the rolling drive portion includes a latch forming the pixel.

11. An electronic apparatus comprising:
a solid-state imaging element including
a pixel having a global drive portion in which all rows are driven at a same timing and a rolling drive portion in which each row is driven at a corresponding timing,
a pixel array region in which a plurality of the pixels is placed in an array,
a global drive circuit configured to supply a drive signal to the global drive portion, and
a rolling drive circuit configured to supply a drive signal to the rolling drive portion,
the global drive circuit being placed on each of at least three or more sides of four sides surrounding the pixel array region.

* * * * *